United States Patent [19]

Harper

[11] 4,284,694

[45] Aug. 18, 1981

[54] METHOD FOR IMPROVING THE ADHERENCE OF A PHOSPHOR-PHOTOBINDER LAYER TO A GLASS SUPPORT

[75] Inventor: Stanley A. Harper, New Providence, Pa.

[73] Assignee: RCA Corporation, New York, N.Y.

[21] Appl. No.: 143,765

[22] Filed: Apr. 25, 1980

[51] Int. Cl.³ .................................................. G03C 5/00
[52] U.S. Cl. ........................................ 430/23; 427/64; 427/68; 427/165; 427/444; 430/28; 430/272; 430/523; 430/935
[58] Field of Search .................................. 430/23–29, 430/935, 272, 523; 427/64, 68, 165, 299, 444

[56] References Cited

U.S. PATENT DOCUMENTS

| | | | |
|---|---|---|---|
| 3,269,838 | 8/1966 | Saulnier | 430/28 |
| 3,481,733 | 12/1969 | Evans | 430/28 |
| 3,940,508 | 2/1976 | Wilcox | 427/68 |
| 3,966,474 | 6/1976 | Harper | 430/23 |

*Primary Examiner*—Edward C. Kimlin
*Attorney, Agent, or Firm*—E. M. Whitacre; G. H. Bruestle; L. Greenspan

[57] ABSTRACT

A layer of an aqueous solution containing polyvinyl alcohol and a zirconyl compound is applied to a clean glass surface and dried to produce a precoating thereon. A subsequently-applied phosphor-photobinder coating thereon is exposed to a light image and then developed with a turbulent aqueous liquid. The phosphor-photobinder coating exhibits improved adherence to the surface during the developing step due to the presence of the precoating.

10 Claims, No Drawings

METHOD FOR IMPROVING THE ADHERENCE OF A PHOSPHOR-PHOTOBINDER LAYER TO A GLASS SUPPORT

BACKGROUND OF THE INVENTION

This invention relates to a method for preparing a luminescent screen, as for a cathode-ray tube, which screen exhibits markedly improved adherence to its supporting surface during the processing thereof.

In preparing a luminescent screen by the slurry-direct photographic process, as described, for example, in U.S. Pat. No. 3,406,068 to H.B. Law, a glass surface, such as the inner surface of the glass faceplate for a color television picture tube, is coated with an aqueous slurry comprising a photosensitizable binder (photobinder), a photosensitizer therefor, and particles of phosphor material. The phosphor-photobinder coating is dried and then exposed to a light pattern, as by exposure through an apartment mask, to produce regions of greater and regions of lesser solubility in the coating. The exposed coating is developed by removing the more-soluble regions of the coating, as by spraying and/or flushing the coating with water or aqueous solution under pressure. The adherence of the retained less-soluble regions of the coating to the glass surface is important and is particularly critical during the development step. The loss of even a small part of the less-soluble regions, which should constitute portions of the screen, requires the screen to be scrapped.

It is known that the adherence of the coating to a clean glass surface can be improved by applying to the glass surface a very thin precoating of a water-soluble polymeric material prior to applying the coating. See, for example, Canadian Pat. No. 602,838 to W. W. Slobbe and U.S. Pat. No. 3,481,733 to L. W. Evans. In a typical process, the surface of a glass panel is washed with an aqueous ammonium bifluoride composition, rinsed with deionized water, then rinsed with a dilute solution of PVA (polyvinyl alcohol) of about 0.2 to 0.5 weight percent concentration and then dried. It is theorized that a very thin, perhaps monomolecular, precoating of PVA remains on the glass surface, which precoating improves the adherence of a subsequently-applied phosphor-photobinder coating. It is not apparent why such a thin precoating improves the adherence of the subsequently-applied coating. However, it has been observed that aging the PVA precoating in air at room temperature, or acidifying the PVA precoating with a mineral acid, further improves the adherence of the subsequently-applied phosphor coating. When heavier screen weights in the range of 4 to 6 milligrams phosphor per square centimeter ($mg/cm^2$) are desired, improved adherence can be achieved by employing a heavy precoating of light-exposed dichromate-sensitized PVA or other photosensitive organic colloid with or without phosphor particles present. Another method, disclosed in U.S. Pat. No. 3,966,474 to S. A. Harper, employs a thick adherent precoating consisting essentially of water-insoluble, organic, polymeric particles, preferably deposited from an aqueous emulsion thereof.

It is the practice, when the phosphor-photobinder coating is being dried on automatic or semiautomatic machines, to heat the coating and the glass support to about 50° to 55° C. When the dry coating is being exposed to the light pattern, the temperature of the glass support has dropped somewhat to about 40° to 45° C. This practice will be referred to herein as the "hot-application" process. It is often desirable to maintain lower temperatures in the glass support while the coating is being dried and is being exposed in order to reduce energy consumption and/or to improve the placement of the retained, less-soluble regions of the coating. A "cool-applicatio" process, in which the coating is dried at temperatures of about 30° to 38° C. and is exposed at temperatures of about 25° to 33° C., has been found to be practical. However, prior precoatings have not been as effective in improving the adherence of the coating in the cool-application process as they are in the hot-application process.

SUMMARY OF THE INVENTION

The novel method comprises depositing on a clean glass surface and then drying a layer of an aqueous solution containing polyvinyl alcohol and a water-soluble zirconyl compound, such as zirconyl nitrate, to produce a precoating. Preferably, the aqueous solution contains about 0.01 to 0.50 weight percent of polyvinyl alcohol and about 0.001 to 0.10 weight percent of zirconyl compound. After the precoating has been deposited, a phosphor-photobinder coating is deposited on the precoating, and the coating is exposed and developed by the slurry direct-photographic process as in the prior art.

By employing the precoating to the glass surface according to the novel method, the subsequently-deposited coating exhibits improved adherence to the surface. Heavier and thicker phosphor coatings can be applied, exposed, and developed without loss of any parts of the screen during the development. Either the cool-application or the hot-application process may be used.

DETAILED DESCRIPTION OF THE PREFERRED EMBODIMENTS

The novel method is an improvement to the slurry-direct photographic process for making a luminescent screen on a glass support. In the novel method as in prior methods, a precoating is applied to the surface of the support, and then a layer of an aqueous slurry including phosphor particles, a binder such as PVA (polyvinyl alcohol), and a photosensitizer therefor is applied to the support and dried.

In the novel method, the precoating is produced by depositing on the glass surface and then drying a solution containing PVA and a zirconyl compound. The zirconyl compound may be, for example, zirconyl chloride [$ZrOCl_2$], zirconyl bromide [$ZrOBr_2$], or zirconyl iodide [$ZrOI_2$]. The preferred compound is zirconyl nitrate [$ZrO(NO_3)_2$]. Combinations of two or more zirconyl compounds may be used. The zirconyl compound may be provided in any purity grade provided the impurities present do not interfere with the fabrication of the screen. The PVA may be any PVA that was previously used or disclosed to be useful for precoating glass supports. A PVA useful for precoating generally has a degree of hydrolysis in the range of 80 to 95 percent. One useful PVA is Vinol No. 540 marketed by Air Products and Chemicals, Inc., Allentown, PA. The aqueous precoating solution contains about 0.01 to 0.50 weight percent of PVA and about 0.001 to 0.10 weight percent of zirconyl compound with respect to the weight of the solution. It is preferred that the dry weight of zirconyl compound is between 1 and 100% of the dry weight of the PVA present. The precoating solution may be applied by any convenient method such as by spraying or flowing the solution on or over the surface. A preferred method is to face the glass surface downward and then to apply a fountain of the precoating solution to the surface. The pH of the precoating solution is generally in the range of about 2.5 to 4.0

EXAMPLE

A specific example of a preferred precoating solution and the practice of the novel method is as follows: Prepare a precoating solution comprising in weight percent of dry solids:

| PVA (87% hydrolyzed) | 0.10% |
|---|---|
| Zirconyl nitrate | 0.02% |
| Water | balance |

Separate aqueous solutions of PVA and zirconyl nitrate are prepared. Then, the zirconyl solution and water are added one at a time to the PVA solution while slowly stirring the mixture.

The inner surface of a glass 25V faceplate panel for a color television picture tube is thoroughly cleaned. Then, the precoating solution is applied to the clean glass surface by facing the surface to be precoated downwardly and then applying the solution as a fountain, after which the surface is permitted to drain. Preferably, the panel rotates at about 30 rpm about an axis that is substantially normal to the surface and that is inclined from vertical no more than about 10°. After the precoating solution is applied, the rotation of the panel is briefly increased to about 100 rpm to remove excess solution. Then, infrared heat and flowing air are applied to dry the precoating. The precoating and panel may reach a temperature up to about 35° C. during the drying step.

Next, the coating composition is applied to the precoated surface. The coating composition comprises a mixture of phosphor particles, a photobinder, a photosensitizer for the binder and water, as is known in the art. One suitable coating composition contains, in about the following proportions, 292 grams of green-emitting, copper-activated zinc-cadmium sulfide particles, 233 grams of a ten-weight-percent aqueous solution of polyvinyl alcohol (Vinol No. 540), 13 grams of a 45-weight-percent aqueous solution of an acrylic copolymer, 14 grams of a ten-weight-percent aqueous solution of sodium dichromate and about 402 grams of deionized water. The coating composition is thoroughly mixed, and the viscosity of the mixture is adjusted to be in the range of about 20 to 50 centipoises. The coating composition is then flow coated upon the precoated surface and dried to produce a dry coating containing about 4.0 mg/cm$^2$ of phosphor particles. The coating and the panel may reach a temperature up to about 35° C. during the drying of the coating.

At this point in the novel method, the panel carries a precoating on the inner surface thereof and phosphor-photo-binder coating on the precoating. The apertured mask for the panel is then inserted on the studs provided therefor and the panel assembly positioned upon a lighthouse platform. Ultraviolet light from a small area light source in the lighthouse is projected through the mask, which permits a pattern of light to fall incident upon and expose the coating. The panel assembly is then removed from the lighthouse and the mask is removed from the panel. The exposed coating is developed by subjecting the coating to a turbulent quantity of aqueous liquid, as by spraying and flushing with water (or an aqueous developing solution) under pressure to remove the unexposed and substantially unexposed more-soluble regions of the coating while retaining the exposed and less-soluble regions of the coating in place.

The novel method may be used to print any particle pattern (pattern of particulate material) upon any glass supporting surface. The particles of the coating may be luminescent or nonluminescent, may be light absorbing and may be any body color in reflected light. The novel method may be used particularly to print viewing-screen structures for cathode-ray tubes. Dot and line viewing-screen structures are examples.

The example illustrates the use of the novel method to produce a screen structure (the green-emitting field) for a color television picture tube by the slurry-direct photographic process. Many suitable coating compositions for the novel method applied to the slurry process are described in U.S. Pat. No. 3,269,838 to T. A. Saulnier, Jr. Preferably, the coating composition is comprised of a water-soluble binder which is cross-linkable into insoluble form by actinic radiation in the presence of hexavalent chromium ions, a soluble dichromate photosensitizer for the binder, and particles of the pattern material. The binder may be any organic colloid, such as gelatin or fish glue, but is preferably a PVA. The photosensitizer may be any soluble dichromate; for example, sodium dichromate, potassium dichromate, or ammonium dichromate. The photosensitizer may be present in amounts of about 2 to 20 weight percent of the weight of the binder present.

The coating is exposed to a pattern of actinic radiation. Any actinic radiation such as visible light rays, ultraviolet light rays, or cathode rays may be used. A significant quality of the exposure is that, although coating portions may be insolubilized by actinic radiation, nevertheless the insoluble coating portions may not adhere sufficiently to the supporting surface to remain in place through the development step. This adherence is improved by the novel method.

Adherence of the exposed coating may be evaluated in a quantitative manner by using the developing-time method. By this method, each of the exposed coatings to be tested is developed with a spray of water with the same spray nozzle using the same pressure to produce the spray. The developing time required to produce the first loss of a less-soluble region of the exposed coating is a measure of the adherence of the coating to the glass support.

TABLE I presents some comparative data giving representative developing times for various samples prepared by the cool-application process in which a glass support received a precoating with a precoating solution containing 0.10 weight percent PVA, then received a coating of green-emitting phosphor which was dried at temperatures of about 35° C., then the dried coating was exposed to a pattern of ultraviolet light at temperatures of about 131° C. and then developed with a water spray.

TABLES II and III present some comparative data giving representative developing times for various samples prepared by the cool-application and the hot-application processes respectively in which a glass support received a precoating with the indicated precoating solution containing about 0.10 weight percent PVA, then received a first coating comprising green-emitting phosphor which was dried (at temperatures of about 49°

C. for the hot-application process and 35° C. for the cool-application process), then the dried first coating was exposed to a pattern of ultraviolet light (at temperatures of about 40° C. for the hot-application process and 31° C. for the cool-application process), and then developed with a water spray. Then, the developed first coating received a second coating comprising blue-emitting phosphor which was dried (at temperatures of about 50° C. for the hot-application process and 35° C. for the cool-application process). Thereafter the dried second coating was exposed to a pattern of ultraviolet light (at temperatures of about 40° C. for the hot-application process and 31° C. for the cool-application process) and then developed with a water spray. The indicated developing times in the TABLES are the developing times of the second coating required to produce the first loss of less-soluble regions from the second coating.

Each of TABLES I, II and III shows that the novel method produces substantially more adherent coatings as compared with similar methods using prior precoatings. TABLE I illustrates that the improved adherence may be realized with a first coating directly on the precoating. TABLES II and III illustrate that the improved adherence may be realized with a second coating that has been applied after a first coating. In the tests listed in TABLES II and III, the retained less-soluble regions of the first and second coatings are each on the precoating and do not overlap one another.

TABLE I

COOL-APPLICATION PROCESS - FIRST COATING ON PRECOATING

| Test No. | Precoating | Developing Time to Initial Losses (Seconds) |
|---|---|---|
| (1) | 0.1% PVA - pH about 5.5 | 18 |
| (2) | 0.1% PVA - acidified to pH 4.1 | 32 |
| (3) | 0.1% PVA with 0.002% zirconyl nitrate (pH about 4.1) | 48 |
| (4) | 0.1% PVA acidified to pH 3.65 with nitric acid | 28 |
| (5) | 0.1% PVA with 0.005% zirconyl nitrate (pH about 3.65) | 73 |
| (6) | 0.1% PVA acidified to pH about 3.15 | 137 |
| (7) | 0.1% PVA with 0.02% zirconyl nitrate (pH about 3.15) | 205 |

TABLE II

COOL-APPLICATION PROCESS - SECOND COATING ON PRECOATING

| Test No. | Precoating | Developing Time to Initial Losses (Seconds) |
|---|---|---|
| (8) | 0.1% PVA acidified to pH 3.15 | 46 |
| (9) | 0.1% PVA with 0.02% zirconyl nitrate (pH about 3.15) | 75 |

TABLE III

HOT-APPLICATION PROCESS - SECOND COATING ON PRECOATING

| Test No. | Precoating | Developing Time to Initial losses (Seconds) |
|---|---|---|
| (10) | 0.1% PVA | 45 |
| (11) | 0.1% PVA acidified to about pH 3.45 | 65 |
| (12) | 0.1% PVA with 0.01% zirconyl nitrate (pH about 3.45) | 120 |

I claim:

1. A method for preparing a luminescent screen upon a glass surface comprising
   (a) depositing on said glass surface a layer of an aqueous solution containing polyvinyl alcohol and a water-soluble zirconyl compound,
   (b) drying said layer to produce a precoating on said surface,
   (c) depositing upon said precoating a coating comprising phosphor particles and a photosensitive binder therefor,
   (d) exposing said coating to a light image whereby to form in said coating selected regions of greater solubility and selected regions of lesser solubility,
   (e) and then developing said exposed coating by selectively removing said regions of greater solubility.

2. The method defined in claim 1 wherein said zirconyl compound is selected from the group consisting of zirconyl bromide, zirconyl chloride, zirconyl iodide, and zirconyl nitrate.

3. The method defined in claim 1 wherein said aqueous solution contains about 0.01 to 0.50 weight percent of said polyvinyl alcohol and about 0.001 to 0.100 weight percent of said zirconyl compound.

4. The method defined in claim 3 wherein said precoating and said coating are dried at temeratures up to about 38° C.

5. The method defined in claim 3 wherein said precoating solution includes about 0.01 to 0.05 weight percent of zirconyl nitrate.

6. A method for preparing a luminescent screen upon a glass surface comprising
   (a) applying to said glass surface a layer of an aqueous solution containing about 0.01 to 0.50 weight percent of polyvinyl alcohol and about 0.001 to 0.10 weight percent of a water-soluble zirconyl compound,
   (b) drying said layer to produce a dry, nonphotosensitive precoating adhered to said glass surface,
   (c) depositing on said precoating a layer of a slurry comprising phosphor particles, polyvinyl alcohol, and a photosensitizer therefor,
   (d) drying said slurry layer to produce a dry, photosensitize coating on said precoating,
   (e) exposing said coating to a light image to produce selected regions of greater solubility and selected regions of lesser solubility in said coating,
   (f) and then developing said coating by applying thereto a turbulent quantity of aqueous liquid to selectively remove said regions of greater solubility.

7. The method defined in claim 6 wherein each of said drying steps (b) and (d) is conducted at temperatures in the range of about 30° to 38° C.

8. The method defined in claim 6 wherein said solution contains about 0.1 weight percent polyvinyl alcohol and about 0.01 weight percent of said zirconyl salt.

9. The method defined in claim 6 wherein said zirconyl compound is zirconyl nitrate.

10. The method defined in claim 6 wherein said developing step includes applying a pressure spray of said aqueous liquid to said exposed coating.

* * * * *

UNITED STATES PATENT AND TRADEMARK OFFICE
CERTIFICATE OF CORRECTION

PATENT NO. : 4,284,694

DATED : August 18, 1981

INVENTOR(S): Stanley Arthur Harper

It is certified that error appears in the above-identified patent and that said Letters Patent is hereby corrected as shown below:

| | |
|---|---|
| Column 1, line 20 | change "apartment" to --apertured-- |
| Column 2, line 7 | change "cool-applicatio" to --cool-application-- |
| Column 4, line 59 | change "131°C" to --31°C-- |
| Column 6, lines 50 and 51 | change "photosensitize" to --photosensitive-- |

Signed and Sealed this

Twenty-seventh Day of October 1981

[SEAL]

*Attest:*

*Attesting Officer*

GERALD J. MOSSINGHOFF

*Commissioner of Patents and Trademarks*